United States Patent [19]
Bernstein et al.

[11] Patent Number: 4,719,596
[45] Date of Patent: Jan. 12, 1988

[54] REGISTER PROVIDING SIMULTANEOUS READING AND WRITING TO MULTIPLE PORTS

[75] Inventors: Kerry Bernstein, Underhill; Anatol Furman, Jericho, both of Vt.

[73] Assignee: International Business Machines Corporation, Armonk, N.Y.

[21] Appl. No.: 841,416

[22] Filed: Mar. 19, 1986

[51] Int. Cl.⁴ .............................................. G11C 7/00
[52] U.S. Cl. .................................... 365/189; 365/154
[58] Field of Search ............... 365/189, 154, 156, 190, 365/202

[56] References Cited

U.S. PATENT DOCUMENTS

| | | | |
|---|---|---|---|
| 3,440,444 | 4/1969 | Rapp | 365/190 X |
| 4,542,483 | 9/1985 | Procyk | 365/190 |
| 4,554,645 | 11/1985 | Furman | 365/189 |
| 4,577,292 | 3/1986 | Bernstein | 365/189 |
| 4,599,708 | 7/1986 | Schuster | 365/189 |

OTHER PUBLICATIONS

IBM Technical Disclosure Bulletin, vol. 26, No. 7B, Dec. 1983, pp. 3626–3627, by M. N. Shen.

Primary Examiner—Joseph A. Popek
Attorney, Agent, or Firm—Sughrue, Mion, Zinn, Macpeak, and Seas

[57] ABSTRACT

A memory cell that allows simultaneous writing into the cell and reading from the cell. The memory cell is a cross-coupled latch in which two pairs of a load transistor and a pull-down transistor are connected at respective first and second coupling points. However, the feedback path from the first coupling point to the gate electrode of the pull-down transistor of the other pair passes through a feedback transistor which can thus selectively open this feedback path. In any access to the memory cell, the feedback path is interrupted. Any one of a plurality of write signals can be impressed upon the gate electrode of the thus separated gate electrodes. Simultaneously, the signal on the first coupling point can be selectively impressed upon any combination of a plurality of read lines. If a simultaneous writing and reading is being performed, the write signal passes immediately through the memory cell to the read lines.

6 Claims, 5 Drawing Figures

REGISTER PROVIDING SIMULTANEOUS READING AND WRITING TO MULTIPLE PORTS

DESCRIPTION

1. Field of the Invention

The invention relates generally to semiconductor registers. In particular, the invention relates to a register capable of being simultaneously written into and read from.

2. Background Art

There exists the need in advanced processor design for a very fast register that can be accessed by a multiplicity of ports. Commonly, the ports are divided into read ports and write ports. For instance, one computer architecture, as described by Furman in U.S. Pat. No. 4,535,428 requires a five port register. During each machine cycle, for example, two writes and three reads are required for the system. For any register location, there is a potential for a single write and perhaps one or more reads nearly simultaneous to the write. The requirement exists that both writes and reads be performed in the single machine cycle. In the prior art, both a write to and a read from register in a single machine cycle has been accomplished by dividing the machine cycle into two sub-cycles, the first for writing into the register and the second and subsequent cycle being for reading from the register. FIG. 1 provides a timing chart of the valid data signals for the five-port system. In a first sub-cycle, two data bits WP1 and WP2 are written into the system at addresses selected by respective decoders. In a second sub-cycle three data bits RP1, RP2 and RP3 are read from selected locations, as selected by decoding circuitry. The third data bit WP3 could be written in the first sub-cycle with a minor addition to the circuitry but this is not required for the desired five-port system. It should be emphasized that all data reads and possibly, at most, one data write shown in FIG. 1 may be addressed to the same register location.

The difficulty with the time multiplex approach is that the single machine cycle must be divided into two read and write sub-cycles. As increasing access rates are imposed on the registers, it is becoming increasingly difficult to design and fabricate the registers which will operate at these speeds. Accordingly, the time multiplexed approach is becoming increasingly unsatisfactory for selective reading or writing of registers in a single machine cycle. Furthermore, since the reading and writing are multiplexed, the timing is complex and the control circuitry becomes cumbersome since the reading and writing occur at different times relative to the address decoding.

SUMMARY OF THE INVENTION

Accordingly, an object of the invention is to provide the simultaneous reading and writing of registers without resort to time multiplexing.

A further object of the invention is to provide for simultaneous access by any of a multiplicity of read ports or write ports in a multi-register file.

It is a further object that a single location be simultaneously written and read.

The invention can be summarized as a memory register, generally having a latch configuration with feedback. One of the feedback paths is interrupted during the access. During the access, one of a plurality of write data lines is gated by respective control signals to impress a data bit onto the latch of one of the transistors of the latch. However, during this same access time, the state of the latch can be read onto any of the multiplicity of read bit lines as gated by respective control signals. At the completion of the access, the interrupted feedback path is reconnected and the latch resumes regenerative feedback to maintain that state. If the same register is simultaneously written and read, the signal impressed on the latch by the writing will be read. In a multi-register file, the control signals may address different registers.

DESCRIPTION OF THE PREFERRED EMBODIMENTS

In this application, a register will be assumed to be a multiple-bit linear storage array for a multiple bit word in which the multiple bits are accessed in parallel. The control circuitry will be the same for all bits in the register. Multiple registers may be arranged in a register file or stack. The different registers will have different addresses to be separately accessed by the read and write ports. Although, the invention will be described for an addressable register file, certain aspects are applicable to a single register for which addressing has no relevance.

Figure 1:
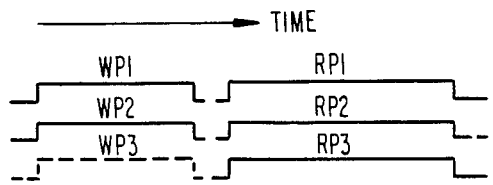
FIG. 1 is a timing diagram for the multiplexed reading and writing in a prior art five-port system.
Figure 2:
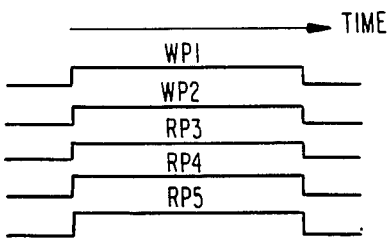
FIG. 2 is a timing diagram for the simultaneous reading and writing in the five-port system of the present invention.

FIG. 2 is a timing diagram that illustrates the valid data signals in a five-port memory system of the present invention. Simultaneously, two data bits WP1 and WP2 can be written into respective registers or locations at the same time that data bits RP3, RP4 and RP5 are being read from selected locations, perhaps the same and perhaps one of the locations selected for writing. Five decoders are required. In this respect, the invention presents a penalty over the prior art which required only three decoders which could be time-multiplexed to perform the address decoding for both the reading and writing operations. However, more importantly, the present invention does not require timemultiplexing so that the same timing circuitry can be used for both the reading and the writing operations.

Figure 3:
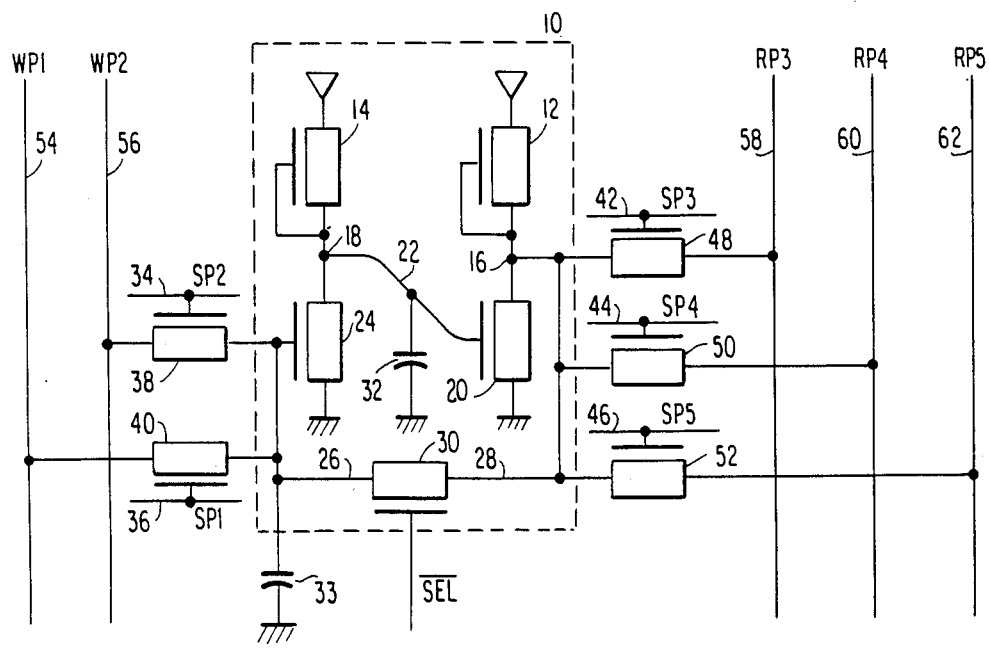
FIG. 3 is a circuit diagram of a memory element in the system of the present invention as implemented in NMOS.

FIG. 3 shows a memory cell in one register according to the present invention. The memory cell is based upon feedback in a latch 10. Two load transistors 12 and 14 are connected between a positive power supply and respectively a first coupling point 16 and a second coupling point 18. The gate electrodes of the load transistors 12 and 14 are connected to the respective coupling points. A first pull-down transistor 20 is connected at its current electrodes between the first coupling point 16 and ground and has its gate electrode connected, in the usual latch configuration, to the second coupling point 18 by a first feedback path 22. A second pull-down transistor 24 has its current electrodes connected between the second coupling point 18 and ground. The two load transistors 12 and 14 are N-type depletion mode transistors (normally on at V=0) and the two pull-down transistors 20 and 24 are N-type enhancement transistors (normally off). However, the gate electrode of the second pull-down transistor 24 has a second feedback path of two parts 26 and 28 linking it to the first coupling point 16. The two parts 26 and 28 of this second feedback path are connected through the current electrodes of a feedback transistor 30. That is, one of the feedback paths of the latch 10 is interruptible. It is already known that a latch feedback path can be turned off during a writing cycle, as disclosed by Rapp in U.S. Pat. No. 3,440,444. The gate electrode of the feedback transistor 30 is controlled by a complemented selection signal −SEL that is low during the accessing as shown in FIG. 2. It should be noted that there is a parasitic capacitance 32 between the first feedback path 22 and ground and another parasitic capacitance 33 between the path 26 of the second feedback path 26 and ground. Typically, these capacitances are an unavoidable artifact of MOS design but are relied upon for this invention. When the second feedback path is interrupted by the feedback transistor 30, the signal on the feedback path capacitances 32 and 33 serve to maintain the latch 10 in its previous state if there is no further impressed signal. These feedback capacitances 32 and 33 are, however, leaky capacitances so that the latch 10 will hold the signal only for a limited time. Nonetheless, this time is more than sufficient for typical access times in which the feedback transistor 30 would be turned off.

In an access to the memory cell, the complemented selection signal −SEL is brought low. Then control signals SP1 and SP2 on control lines 34 and 36 for the gate electrode of two writing transistors 38 and 40 and control signals SP3, SP4 and SP5 on control lines 42, 44 and 46 for three reading transistors 48, 50 and 52 are selectively brought high by respective address decoders. The high control signals render the respective reading and writing transistors 38, 40, 48, 50 and 52 conductive. There is a requirement that the system be so designed that only one of the two writing transistors 38 and 40 in a particular location is selected in any machine cycle. Otherwise, any combination of the reading and writing transistors 38, 40, 48, 50 and 52 can be selectively addressed. This requirement may be imposed either upon the decoders or the system inputting the decoders.

The writing operation will be described first. The two writing transistors 38 and 40 each have a current electrode connected to the first portion 26 of the second feedback path so as to control the gate electrode of the second pull-down transistor 24. The other current electrodes of the writing transistors 38 and 40 are connected to respective write lines 54 and 56 that are connected to the two write ports. It is to be understood that the two write lines 54 and 56 are connected similarly to a multiplicity of memory cells of different registers that are differently addressed. If either of the writing transistors 38 and 40 are selectively addressed, that transistor is made conductive and the data signal on the connected write line 54 or 56 determines the charge state of the capacitor 33 and thus controls the gate electrode of the second pull-down transistor 24. As a result, the state of the latch 10, even with the feedback transistor 30 being opened, is determined. That is, the feedback capacitor 32 is charged or discharged according to the written data. At the end of the write cycle, the control signal SP1 or SP2 to the enabled writing transistor 38 or 40 is returned to a low value to isolate the latch 10 from the write lines 54 and 56. The capacitances 32 and 33 hold this state of the latch 10 until, shortly thereafter, the complemented selection signal −SEL is returned to a high value and the feedback transistor 30 is again made conductive. At this point, the second feedback path is reconnected and the latch 10 becomes fully regenerative.

In a reading operation, one or more of the reading transistors 48, 50 and 52 are rendered conductive by the control signals SP3, SP4 and SP5 supplied to their respective gate electrodes on control lines 42, 44 and 46 by respective address decoders. The three reading transistors 48, 50 and 52 each have one current electrode connected to the first coupling point 16 and the other current electrode connected to respective read lines 58, 60 and 62. As a result, in a reading operation the electrical signal at the first coupling point 16 is impressed upon whatever of the read lines 58, 60 and 62 have been connected to the latch 10. Although the second feedback path is opened by the feedback transistor 30 during a reading opreation, there is power being supplied to the first coupling point 16 by the first load transistor 12 and the first pull-down transistor 20. If there is not a simultaneous write operation to the memory cell, the state of the latch is maintained by the capacitances 32 and 33 during the disconnection. The memory effect is dynamic but is sufficient for a reasonable reading period.

If, however, there is a simultaneous reading and writing, then the data signal on one of the write lines 54 and 56 is applied to the gate electrode of the second pull-down transistor 24. The second pull-down transistor 24 and the first pull-down transistor 20 act as a two-stage amplifier for impressing the written signal upon the first coupling point 16. The capacitances 32 and 33 are overwritten by the powered writing operation. Therefore, in a simultaneous reading and writing, the same signal that is written into the memory cell is also read onto whatever read lines 58, 60 and 62 have been selected. The previous state of the latch 10 does not inhibit the change of the newly written state of the latch, that is, there is no write disturbances due to the previous state of the latch and there is no unanticipated interaction between the writing and the other reading. That separate transistors are provided for reading and writing is important in that it is thus always possible to guarantee a positive write condition and a positive read condition without contradictory design requirements on device sizes and parameters.

Both the writing and the reading in FIG. 3 is single ended in that a signal is directly written only onto the second coupling point 18 and a signal is directly read only from the second coupling point 16. The more typical procedure in the prior art without feedback interruption was to differentially read to and write from both the first and second coupling points. A few prior art attempts for single ended reads and writes without feedback interruption were largely unsuccessful because of write disturbances propagating across the latch 10. The feedback disconnection by Rapp in U.S. Pat. No. 3,440,444 never addressed the problem of simultaneous reading and writing.

In the design of the memory cell, it is important that the beta ratio of the first pull-down transistor 20 and the multiplicity of the reading transistors 38, 40 and 42 be accounted for by making the first pull-down transistor 20 sufficiently large. This requirement potentially sets an upper limit to the number of read ports. However, Furman in U.S. Pat. Nos. 4,535,428 and 4,554,645 discloses how this limitation on the number of read ports can be overcome and how the first pull-down transistor 20 may be designed to guarantee memory cell stability by using only one read from a given address while still preserving the multi-port capability of the read function. It should be noted that this use of a single read is the preferred embodiment so that only one of the reading transistors 48, 50 and 52 is rendered conductive at any one time.

It is of course obvious that the invention can be extended to almost any number of write ports and read ports if the above described teachings of the Furman application are utilized.

Figure 4:
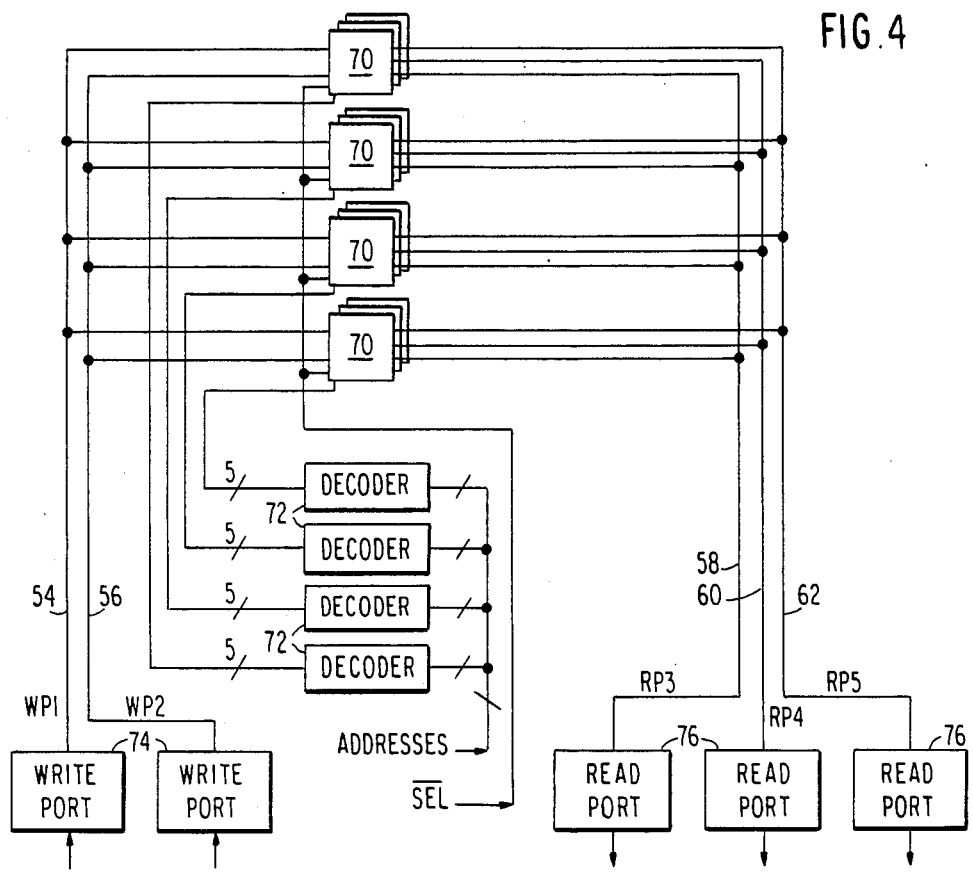
FIG. 4 is a block diagram of a five-port system.

The register of FIG. 3 can be used in a memory system as shown in FIG. 4. The system contains a plurality of memory elements 70, each containing a latch 10 and the reading and writing transistors 38, 40, 48, 50 and 52. Each memory element 70 has an associated decoder 72 providing the five control signals SP1 and SP2, for the reading transistors 38 and 40, and SP3, SP4 and SP5 for the writing transistors 48, 50 and 52. The decoders 72 receive control signals and the system must be designed so that active control signals SP1 and SP2 are not simultaneously provided to particular memory elements. Also, the decoders 72 must not have more than one memory element 70 being read onto a read line 58, 60 or 62 at a given time. The control information supplied to the decoders 72 may be five addresses corresponding to SP1-SP5. The write lines 54 and 56 receive digital signals from respective write ports 74 and the read lines 58, 60 and 62 provide digital signals to respective read ports 76. The memory system is likely to have replicated versions of the memory elements 70 to provide parallel bits in a data word. The replicated memory elements would be controlled by the same decoders 72 and selection signal —SEL but have separate write lines 54 and 56 and read lines 58, 60 and 62. Needless to say, an actual memory system is larger and more complex than FIG. 4 but the concept remains the same.

Figure 5:
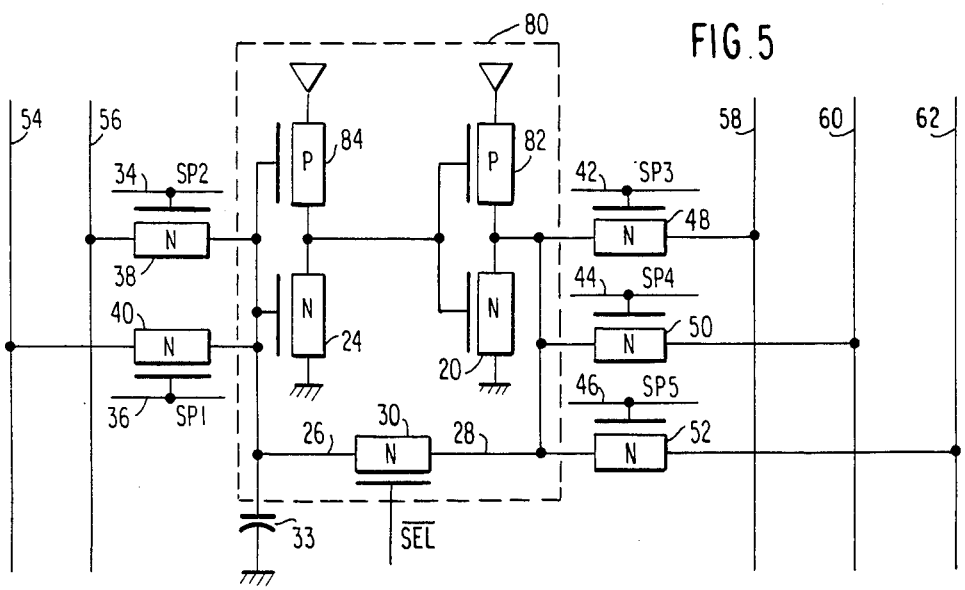
FIG. 5 is a circuit diagram corresponding to FIG. 3 but implemented in CMOS.

Because of its power saving capability, it is recommended that the latch be implemented in CMOS, as illustrated in FIG. 5 rather than NMOS. A CMOS latch 80 is very similar to the NMOS latch 10 except for P-type transistors 82 and 84 and the modified feedback paths such that the P-type transistor 82 or 84 is complementary to the N-type transistor 20 or 24. Otherwise, the operation remains the same.

A principal advantage of the invention is that time multiplexing is not required so that timing circuitry associated with reading and writing in an array of such memory cells can be considerably simplified. Although some of the prior art have described their reading and writing as being simultaneous, in fact, the two operations were simultaneous only in the sense that they occurred in a single machine cycle and that the reading operation was time-separated from the writing operation. In the present invention, the control signals for both reading and writing have equivalent timing. Furthermore, the elimination of time-multiplexing allows a considerable increase in the machine cycle rate within a given fabrication technology.

What we claim is:

1. A memory system comprising:
    first and second field effect transistors,
    first and second loads serially connected to said first and second transistors, respectively, a first common point between said first transistor and said first load being connected to the control electrode of said second transistor,
    a third field effect transistor connected from a second common point between said second transistor and said second load to the gate electrode of said first transistor,
    means for selectively applying a first control voltage to the control electrode of said third transistor,
    a first write line,
    a fourth field effect transistor connected between said first write line and the control electrode of said first transistor,
    means for selectively applying a second control voltage to the control electrode of said fourth transistor,
    a first read line,
    a fifth field effect transistor connected between read line and said second common point, and
    means for selectively applying a third control voltage to the control electrode of said fifth transistor concurrently with applying said second control voltage to the control electrode of said fourth transistor.

2. A memory system as set forth in claim 1 wherein:
    said second and third control voltages applied to the control electrodes of said fourth and fifth transistors are derived from address signals and further including means for applying binary data signals to said first write line.

3. A memory system as set forth in claim 2 further including:
    a second write line,
    a sixth field effect transistor connected between said second write line and said first common point,
    a second read line,
    a seventh field effect transistor connected between said second read line and said second common point and
    means for applying said second and third control voltages derived from said address signals to the control electrodes of said sixth and seventh transistors.

4. A memory system as recited in claim 3, wherein there are a plurality of sets of said first, second, third, fourth, fifth, sixth and seventh transistors, first and second loads, said sets arranged in an addressable file, and connected to the same first and second read lines and the same first and second write lines.

5. A memory system as set forth in claim 1 wherein said first and second loads are field effect transistors of a conductivity type opposite that of said first and second transistors.

6. A memory system as set forth in claim 1, wherein there are a plurality of sets of said first, second, third, fourth and fifth transistors, first and second loads, first read lines and first write lines, said sets arranged in a register and wherein said means for applying said first, said second and said third control voltages applies said first, said second and said third control voltages to said control electrodes of all said third, fourth and fifth transistors respectively.

* * * * *